United States Patent

Vaes et al.

[11] Patent Number: 5,518,875
[45] Date of Patent: May 21, 1996

[54] METHOD FOR OBTAINING A PHOTOGRAPHIC MATERIAL SUITABLE FOR USE IN PHOTOTYPESETTING APPLICATIONS

[75] Inventors: Jos Vaes, Betekom; Luc Wabbes, Mortsel, both of Belgium

[73] Assignee: Agfa-Gevaert, N.V., Mortsel, Belgium

[21] Appl. No.: 412,870

[22] Filed: Mar. 29, 1995

[30] Foreign Application Priority Data

Apr. 19, 1994 [EP] European Pat. Off. ............ 94201072

[51] Int. Cl.⁶ .............................. G03C 1/09; G03C 8/06
[52] U.S. Cl. ................... 430/569; 430/567; 430/605; 430/608; 430/612; 430/204
[58] Field of Search ................................ 430/569, 567, 430/605, 608, 612, 204

[56] References Cited

U.S. PATENT DOCUMENTS 5,059,508  10/1991  Vaes et al. ....................... 430/569
5,391,474   2/1995  Haefner et al. .................... 430/569

FOREIGN PATENT DOCUMENTS 0568091  11/1993  European Pat. Off. .

*Primary Examiner*—Mark F. Huff
*Attorney, Agent, or Firm*—Breiner & Breiner

[57] ABSTRACT

The present invention provides a method for obtaining a photographic material by coating on a support at least one layer comprising at least one photosensitive silver halide emulsion wherein the silver halide crystals contain silver chloride for at least 60 mole %, silver bromide in a range from 5 mole % to 40 mole % and silver iodide in a range from 0 mole % to 1 mole %, characterized in that a water soluble iridium compound is added between the end of the physical ripening and the end of the chemical ripening to said silver halide emulsion at a pH between 4 and 6.5, at a pCl between −0.3 and 1 and at a ratio by weight of gelatin to silver halide, expressed as equivalent amount of silver nitrate between 0.05 and 0.5.

10 Claims, No Drawings

METHOD FOR OBTAINING A PHOTOGRAPHIC MATERIAL SUITABLE FOR USE IN PHOTOTYPESETTING APPLICATIONS

1. FIELD OF THE INVENTION

The present invention relates to a method for making a silver halide photographic material sensitive to high intensity-short time exposure and especially to a method for making such a material that can be used for obtaining a lithographic printing plate according to the silver salt diffusion transfer process and to a method for obtaining said lithographic printing plate.

2. BACKGROUND OF THE INVENTION

With recent rapid progress of information transmitting systems, silver halide photographic light sensitive materials have been increasingly required to have high sensitivity. Such systems are, for example, high speed phototypesetting systems according to which information output from an electronic computer is immediately displayed as letters or figures by a cathode ray tube and press facsimile systems for rapid transmission of newspaper originals to a remote place.

Todate on the market phototypesetters usually work with a He/Ne laser (632 nm), laser diode (650 nm or 680 nm) or LED (670 nm or 780 nm). Especially phototypesetters that operate with a He/Ne laser or LED are frequently employed, but also argon lasers (488 nm) are still in use.

For a photographic material to be suitable for use in phototypesetting applications it is required that the material is of high speed to so-called high intensity-short time exposure (flash exposure or scanning exposure), namely exposure for $10^{-4}$ second or less and yields images of high contrast and high resolving power.

Photographic phototypesetting materials include photographic films and papers used in a process for preparing a lithographic printing plate and silver salt diffusion transfer based (hereinafter called DTR-) lithographic printing plates disclosed in e.g. U.S. Pat. No. 4,501,811 and U.S. Pat. No. 4,784,933. With the latter materials a lithographic printing plate is immediately obtained without the need of a contact exposure or camera exposure.

A photographic DTR material preferably comprises a silver halide emulsion mainly consisting of silver chloride in order to obtain a sufficiently high rate of solution of the silver halide and a satisfactory gradation necessary for graphic purposes. Only a small amount of silver bromide and/or silver iodide usually not exceeding 5 mole % is present. However as a consequence of the lower energy output of some lasers, e.g. laserdiodes, the sensitivity of these conventional silver chloride DTR emulsions is no longer sufficient when using those types of laser as exposure unit as disclosed in U.S. Pat. No. 5,059,508.

So, in order to obtain DTR materials which can be used for high intensity-short time exposure and which will give good lithographic printing plates it is taught to use an silver halide emulsion with iridium built in as a dopant by adding said iridium during the precipitation and/or the physical ripening of the silver halide and/or a higher silver bromide content as disclosed in e.g. U.S. Pat. Nos. 4,621,041 and 5,059.508.

All these patents teaching the addition of iridium during the precipitation and/or the physical ripening of the silver halide reflect the belief that the activity of the iridium dopant depends enormously on the time of its addition. It has been described in e.g. Journal of the Society of Scientific Photography of Japan, 31, 34(1968) that the addition of small amounts of hexachloroiridate at the precipitation of a silver halide emulsion strongly increases the speed of said emulsion to so-called high intensity-short time exposure due to the iridium ion built in as a dopant in the silver halide crystal. The addition of hexachloroiridate at a later stage in the preparation of a silver halide emulsion has no such effect because the iridium ion is then not longer built in in the silver halide crystal but absorbed to or incorporated into the surface of the silver halide crystal having only a stabilizing effect on the latent image stability.

However, the images or lithographic plates obtained by processing the photographic materials containing an above mentioned emulsion are still not quite satisfactory, especially in respect to minimal and maximal density and contrast.

An image with a low minimal and a high maximal density and a high contrast results in a better sharpness. When the photographic material is to be used in a silver salt diffusion transfer process and especially for preparing printing plates according to this process it is necessary to obtain a silver image with lower minimal and/or higher maximal density and/or higher contrast to improve the printing properties i.a. higher printing endurance, better ink acceptance in the printing areas, less ink acceptance in the non printing areas both during start-up of the printing process (toning) and during printing (staining), sharper prints.

Furthermore, the activity of the built-in iridium complex depends enormously on the conditions during its addition. It is known that the initial ligands of commercially available iridium complexes can exchange with other ligands (water, hydroxyl ions, etc.). This exchange reaction happens whenever the halogen complex is dissolved and the rate is very much depending on the temperature, the acidity, the amount of free silver ions etc. of the medium. So, said activity is therefore unpredictable when the iridium complex is added during the physical ripening and surely during the precipitation of a silver halide emulsion when the above mentioned parameters are constantly changing. So the possibility of adding the iridium complex to the silver halide emulsion under well defined conditions would be a much appreciated improvement.

EP-A 568.091 discloses a process reducing reciprocity failure of a silver chloride emulsion comprising adding irridium and bromide to said chloride emulsion wherein said bromide is added simultaneously or after said irridium. This document does not disclose a method for obtaining an image with a higher contrast. Furthermore, the addition of said bromide is an additional step in the preparation of said emulsion and can easily leads to irreproducible photographic results due to the partial conversion of silver chloride to silver bromide in said silver chloride emulsion.

3. SUMMARY OF THE INVENTION

It is an object of the present invention to provide a method for obtaining a silver halide photographic material having a high sensitivity to high intensity-short time exposure and that can yield images of good quality, especially of high contrast.

It is another object of the present invention to provide a method for obtaining an image with said photographic material.

It is a further object of the present invention to provide a method for obtaining an imaging element having a high sensitivity to high intensity-short time exposure that can be used for obtaining a lithographic printing plate of high contrast according to the silver salt diffusion transfer process.

It is a still further object of the present invention to provide a method for obtaining a lithographic printing plate of high contrast according to the silver salt diffusion transfer process using said imaging element.

Further objects of the present invention will become clear from the description hereinafter.

According to the present invention there is provided a method for obtaining a photographic material by coating on a support at least one layer comprising at least one photosensitive silver halide emulsion, the preparation of said photosensitive silver halide emulsion comprising the steps of (i) formation of a silver halide emulsion by precipitation of silver halide crystals in an aqueous medium, (ii) physical ripening of said silver halide emulsion, (iii) desalination of said silver halide emulsion and (iv) chemical ripening of said silver halide emulsion, the silver halide crystals of said photosensitive silver halide emulsion containing silver chloride for at least 60 mole %, silver bromide in a range from 2 mole % to 40 mole % and silver iodide in a range from 0 mole % to 1 mole %, characterized in that a water soluble iridium compound is added between the end of the physical ripening and the end of the chemical ripening to said silver halide emulsion at a pH between 4 and 6.5, at a pCl between −0.3 and 1 and at a ratio by weight of gelatin to silver halide, expressed as equivalent amount of silver nitrate between 0.05 and 0.5.

According to the present invention there is provided a method for obtaining an image with the above defined photographic material using high intensity short time exposure followed by development.

According to the present invention there is also provided a method for obtaining an imaging element by coating on a support at least one silver halide emulsion layer as defined above and an image receiving layer containing physical development nuclei in water permeable relationship with said silver halide emulsion layer.

According to the present invention there is also provided a method for obtaining a lithographic printing plate according to the silver salt diffusion transfer process comprising image-wise exposing with a high intensity-short time exposure an imaging element as described above and developing said imaging element using an alkaline processing liquid in the presence of developing agent(s) and a silver halide solvent.

4. DETAILED DESCRIPTION OF THE PRESENT INVENTION

After extensive research it has been found that a silver halide photographic material having a high sensitivity to high intensity-short time exposure can be made by coating on a support at least one silver halide emulsion wherein the silver halide crystals contain silver chloride for at least 60 mole %, silver bromide in a range from 2 mole % to 40 mole % and silver iodide in a range from 0 mole % to 1 mole %, when a water soluble iridium compound is added between the end of the physical ripening and the end of the chemical ripening to said silver halide emulsion at the above defined conditions. Said photographic material yields images of good quality, especially of high contrast. Furthermore, a lithographic printing plate according to the silver salt diffusion transfer process can be obtained by image-wise exposing with a high intensity-short time exposure an imaging element containing such an silver halide emulsion.

After the precipitation of the silver halide crystals, their size will still increase by physical ripening due to Ostwald ripening and/or coalescence as described e.g. in the book "Photographic Chemistry" by Pierre Glafkides—Fountain Press—London (1958), p. 305–306. The end of the physical ripening is easily detected by measuring in function of the time the size of the silver halide crystals till no further increase of the size of the grains occurs. The grain size and distribution can be measured by any of the well known techniques, such as described e.g. by T. H. James in "The Theory of the Photographic Process", fourth ed., p.101, Macmillan Publishing Co. Inc., New York (1977), or by the method proposed by G. Moeller at the Int. Congress on Phot. Sci., Moskou (1970). In this last method, by the diameter of a silver halide grain is meant the diameter of a sphere with an equivalent volume as the corresponding silver halide grain. The number average diameter r of the silver halide grains is the average of all these diameters. Furtheron, when there is referred to the diameter of a silver halide grain or to the average diameter r of the silver halide grains there is always meant the diameter,respectively the average diameter of (a) silver halide grain(s) as determined by this last method.

Chemical ripening or sensitization of a silver halide emulsion is the process wherein the speed of the silver halide emulsion is increased by adding specific compounds and/or changing the silver halide emulsion conditions such as pH, pAg, temperature, etc. The chemical ripening is ended when the speed and the fog of the silver halide emulsion change no longer, what is mostly effected by adding specific compounds and/or lowering the temperature of the silver halide emulsion.

According to the invention, the water soluble iridium compound may be added at any time between the end of the physical ripening and the end of the chemical ripening to said silver halide emulsion provided said silver halide emulsion has a pH between 4 and 6.5, a pCl between −0.3 and 1 and a ratio by weight of gelatin to silver halide, expressed as equivalent amount of silver nitrate between 0.05 and 0.5 e.g. after the physical ripening but before, during or after the desalination of the silver halide emulsion, at the beginning or during the chemical ripening.

Preferably the water soluble iridium compound is added between the end of the physical ripening and the beginning of the chemical ripening, more preferably between the end of the physical ripening and before the desalination of the silver halide emulsion.

During the addition of the water soluble iridium compound the silver halide emulsion has a pH between 4 and 6.5, more preferably between 4.3 and 5.5, most preferably between 4.5 and 5.2. The pCl of said silver halide emulsion is comprised between −0.3 and 1, more preferably between −0.2 and 0.5, most preferably between −0.15 and 0.15. The ratio by weight of gelatin to silver halide, expressed as equivalent amount of silver nitrate lies between 0.05 and 0.5, more preferably between 0.1 and 0.4, most preferably between 0.15 and 0.25.

As the water soluble iridium compounds, various compounds may be used such as iridium chloride ($IrCl_3$ or $IrCl_4$), hexachloroiridic acid (III) or salts thereof, hexachloroiridic acid (IV) or salts thereof, etc. Preferably the concentration of the water soluble iridium compound added between the end of the physical ripening and the end of the chemical ripening ranges from $10^{-8}$ to $10^{-3}$ mole per mole AgNO$_3$, more preferably from $10^{-7}$ to $10^{-5}$ mole per mole AgNO$_3$.

According to the present invention the amount of bromide or iodide added to the silver halide emulsion simultaneously or after the addition of the water soluble iridium compound to said emulsion is preferably less than 0.3 mole/mole AgX, more preferably less than 0.2 mole/mole AgX, most preferably substantially 0 mole/mole AgX.

According to the present invention the silver halide emulsion comprises principally silver chloride while a fraction of silver bromide is present ranging from 2 mole % to 40 mole %, and of silver iodide ranging from 0 mole % mole % to 1 mole %. Preferably said fraction of silver bromide ranges from 12 mole % to 35 mole %, more preferably from 15 mole % to 25 mole %. The silver halide emulsion preferably belongs to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The photographic silver halide emulsion(s) for coating a silver halide emulsion layer in accordance with the present invention can be prepared according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The precipitation of the silver halide crystals is carried out by mixing soluble silver salts and soluble halides, preferably under such conditions that at the end of the precipitation the number average grain size r of the silver halide crystals is at least 50%, more preferably at least 75% of the number average grain size of the silver halide crystals of the photographic silver halide emulsion.

Subsequently, said silver halide emulsion is physically ripened.

The photosensitive silver halide emulsion(s) can also be prepared under Ostwald growth conditions, by continuously adding fine grains to the reaction vessel. The grains are grown in the absence or in the presence of any product having a site-directing activity.

A rhodium containing compound is usually added to the silver halide emulsion, preferably during the precipitation stage, more preferably between the addition of 0 mole % and 60 mole % of the silver salt, most preferably between the addition of 2 mole % and 35 mole % of the silver salt. The concentration of the added rhodium compound(s) preferably range(s) from $10^{-8}$ to $10^{-3}$ mole per mole of AgNO$_3$, more preferably from $0.5*10^{-7}$ to $10^{-5}$ mole per mole of AgNO$_3$.

However, the rhodium containing compound may also be added at any other time during the silver halide emulsion preparation, e.g. before or after any of the well known desalting stages of the silver halide emulsion, before or after adding any supplementary colloid binder, before or after any spectral or chemical sensitization or stabilization stage, etc.

Likewise a further amount of an iridium containing compound may be added to the silver halide emulsion at any time during the silver halide emulsion preparation after the end of the chemical ripening and/or when the silver halide emulsion conditions of pH, pCl or ratio by weight of gelatin to silver halide, expressed as equivalent amount of silver nitrate, do not correspond to the silver halide emulsion conditions in accordance with the present invention.

The silver halide emulsion is chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A-493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 6, 65–72 (1951).

The silver halide emulsion is desalted by one of the well known techniques e.g. by flocculating said silver halide emulsion, washing it with water or an aqueous solution and redispersing it, by ultrafiltration, etc. Preferably, the desalination of the silver halide emulsion is carried out before the chemical ripening of the silver halide emulsion, but can also be carried out afterwards.

The average size of the silver halide grains in the photosensitive silver halide emulsion may range from 0.10 to 0.70 µm, preferably from 0.25 to 0.4 5 µm.

The silver halide emulsion can be spectrally sensitized according to the spectral emission of the exposure source for which the photographic element is designed.

Suitable sensitizing dyes for the visible spectral region include methine dyes such as those described by F. M. Hamer in "The Cyanine Dyes and Related Compounds", 1964 John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,485, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic silver halide emulsions in the form of an aqueous solution, a solution in an organic solvent or in the form of a dispersion.

The silver halide emulsions may contain the usual emulsion stabilizers. Suitable silver halide emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable silver halide emulsion stabilizers are i.a. heterocyclic mercapto compounds e.g. phenylmercaptotetrazole, quaternary benzothiazole derivatives, and benzotriazole.

The silver halide emulsions may contain pH controlling ingredients. Preferably the silver halide emulsion layer is coated at a pH value near the isoelectric point of the gelatin to improve the stability characteristics of the coated layer. Other ingredients such as antifogging agents, development accelerators, preferably polyalkyleneoxide derivatives having a molecular weight of at least 400 such as those described in e.g. U.S. Pat. Nos. 3,038,805, 4,038,075 and 4,292,400, wetting agents and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P 2,453,217.

More details about the composition, preparation and coating of silver halide emulsions can be found in e.g. Product Licensing Index, Vol. 92, Dec. 1971, publication 9232, p. 107–109.

The photographic material of the present invention may contain additional hydrophilic layers, in water permeable relationship with the photosensitive silver halide emulsion layer. Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the silver halide emulsion layer; as alternative finely divided carbon black can be used for the same antihalation purposes as described in U.S. Pat. No. 2,327,828. On the other hand, in order to gain sensitivety, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the silver halide emulsion layer the other hydrophilic layers are coated preferably at a pH value near the isoelectric point of the gelatin. But instead of or together with gelatin, use can be made of one or more other natural and/or synthetic hydrophilic colloidst e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazinet and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat No. 4,063, 952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic silver halide emulsion layer or in at least one other hydrophilic colloid layer. Examples of suitable surface-active agents are described in e.g. EP 545442. Preferably compounds containing perfluorinated alkyl groups are used.

The photographic material of the present invention may further comprise various other additives such as e.g. compounds improving the dimensional stability of the photographic element, UV-absorbers, spacing agents and plasticizers.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. poly(ethylene terephthalate) film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

According to a preferred method of the present invention the above described photographic material element is information-wise exposed using a scanning exposure beam and is subsequently developed in an alkaline processing liquid in the presence of developing agents.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used. Said developing agents may be contained in an alkaline processing liquid but are preferably contained in one or more layers of the photographic element. In the latter case the alkaline processing liquid merely serves as an alkaline activating liquid.

The pH of said alkaline liquid is preferably between 9 and 14, more preferably between 10 and 13 and may be established by an organic and/or inorganic alkali agent. Examples of suitable alkali agents are e.g. sodium hydroxide, carbonates, phosphates, alkanolamines or mixtures thereof.

The alkaline processing liquid preferably also contains a preserving agent having antioxidation activity, e.g. sulphite ions. Further may be present a thickening agent, fog inhibiting agents, calcium-sequestering compounds, anti-sludge agents, development accelerators and hardeners including latent hardeners.

The above described development step is preferably followed by a washing step, a fixing step and another washing or stabilizing step. The first washing step may be omitted.

The above described photographic material, obtained according to the present invention may yield an image according to the silver salt diffusion transfer process. The principles of the silver complex diffusion transfer reversal process, hereinafter called DTR-process have been described e.g. in U.S. Pat. No. 2,352,014 and the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Suitable silver complexing agents also called silver halide solvents for use in accordance with the present invention are e.g. thiosulphate or thiocyanate in an amount ranging from 5 g to 20 g per liter. Other interesting silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers as disclosed in e.g. U.S. Pat. No. 4.960.683 and EP-A 554,585.

Still further suitable silver halide solvents are 1,2,4-triazolium- 3-thiolates, preferably 1,2,4-triazolium-3-thiolates.

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

Preferred physical development nuclei for use in accordance with the present invention are sulphides of heavy metals e.g. sulphides of antimony, bismuth, cadmium, cobalt, lead, nickel, palladium, platinum, silver, and zinc. Especially suitable physical development nuclei in connection with the present invention are palladium sulphide nuclei. Other suitable physical development nuclei are salts such as e.g. selenides, polyselenides, polysulphides, mercaptans, and tin (II) halides. Heavy metals, preferably silver, gold, platinum, palladium, and mercury can be used in colloidal form.

According to a preferred embodiment of the present invention a method is provided for obtaining an imaging element that can be used for obtaining a lithographic printing plate according to the DTR-method. Said imaging element is obtained by coating on a support in the order given at least one silver halide emulsion layer in accordance with the present invention and an image receiving layer containing physical development nuclei in water permeable relationship with said silver halide emulsion layer. Preferably the imaging element also comprises a base layer between the support and the silver halide emulsion layer as described above. A further intermediate layer between the silver halide emulsion layer and the layer containing physical development nuclei may also be provided.

A matting agent is preferably included in said base layer and optionally in small amounts i.e. from 1 to 20% by weight in the silver halide emulsion layer. When the matting agent is included in the silver halide emulsion layer it is preferable added to the silver halide emulsion after spectral sensitization of the silver halide emulsion to avoid adsorption of the sensitizer to the matting agent. Suitable matting agents for use in accordance with the present embodiment are water insoluble inorganic or organic particles having an average diameter between 1 µm and 10 µm most preferably between 4 µm and 8 µm. A preferred matting agent is silica.

The layer containing physical development nuclei is preferably free of hydrophilic binder but may comprise small amounts upto 30% by weight of the total weight of said layer of a hydrophilic colloid e.g. polyvinyl alcohol to improve the hydrophilicity of the surface.

Preferably used supports in connection with the present embodiment are paper supports or resin supports e.g. polyester film supports.

To obtain a lithographic printing plate the above described DTR-imaging element is information-wise exposed using a scanning exposure and is subsequently developed with an alkaline processing liquid in the presence of developing agent(s) and silver halide solvent(s). Said development step is preferably followed by a neutralization of the surface of the imaged element by guiding the element through a neutralization liquid having a pH between 4 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP-150,517, wetting agents e.g. saponins or pluronics etc.

The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

To improve the differentiation between the hydrophobic silver image and the hydrophilic background the alkaline processing liquid and/or neutralization liquid preferably contain one or more hydrophobizing agents, e.g. those described in U.S. Pat. No. 3,776,728, and U.S. Pat. No. 4,563,410. Preferred hydrophobizing agents are mercapto-1,3,4-thiadiazoles as described in DE-A 1,228,927 and in U.S. Pat. No. 4,563,410, 2-mercapto-5-alkyl-oxa-3,4-diazole and long chain (at least 5 carbon atoms) alkyl substituted mercaptotetrazoles. Particularly preferred compounds are 5-n-heptyl-2mercapto-1,3,4-oxadiazol and 3-mercapto-4-acetamido-5-n-heptyl-1,2,4,-triazole.

According to an alternative embodiment of the present invention another method is provided for obtaining an imaging element that can be used for obtaining a lithographic printing plate according to the DTR-method by coating in the order given on a hydrophilic surface of a support (i) an image receiving layer containing physical development nuclei and (ii) a photosensitive layer comprising a photosensitive silver halide emulsion in accordance with the present invention, said photosensitive layer being in water permeable relationship with said image receiving layer. To obtain a lithographic plate by means of the DTR-process said imaging element may be imaged using an information-wise exposure as described above followed by a development step in the presence of development agent(s) and silver halide solvent(s) so that a silver image is formed in the physical development nuclei layer. Subsequently the imaging element is treated to remove the layer(s) on top of the image receiving layer, preferably by rinsing the imaging element with water, thereby exposing the imaged surface of the support by uncovering said silver image formed in said image receiving layer. Finally the hydrophobic character of the silver image is preferably improved using a finishing liquid comprising hydrophobizing agents as described above.

To facilate the removal of the silver halide emulsion layer it is advantageous to provide a hydrophilic layer between the aluminium support and the silver halide emulsion layer. Preferably used hydrophilic layers for this purpose are layers comprising a hydrophilic non-proteinic film-forming polymers e.g. polyvinyl alcohol, polymer beads e.g. poly-(meth)acrylate beads or mixtures thereof. Such type of layers are disclosed in EP-A-483415 and EP-A-410500.

The present invention is illustrated by the following examples without limiting it thereto. All parts are by weight unless otherwise specified.

EXAMPLE 1

Preparation of the silver halide emulsion coating solution.

A gelatin silver halide emulsion I was prepared using the double jet precipitation by slowly mixing whilst stirring 975 ml of an aqueous solution of $AgNO_3$ having a concentration of 2 mole/l, and 1353 ml of an aqueous solution having a concentration of 1.7 mole/l of NaCl and 0.48 mole/l of KBr. Before the precipitation $5*10^{-7}$ mole of sodium hexachlororhodaat and $1*10^{-6}$ mole of sodium hexachloroiridaat was added to the alkali halide solution. In a second part of the precipitation 1050 ml of an aqueous solution of $AgNO_3$ having a concentration of 1 mole/l was slowly mixed with 1275 ml of an aqueous solution of NaCl at a concentration of 1.3 mole/l.

The temperature during the silver halide formation was 55° C., the pH was 4.6 and the pCl 0.03. The silver halide emulsion was left standing for 10 minutes more at the same temperature, pH and pCl. At 1 minute, 5 minutes and 9 minutes after the silver halide formation, the grain size distribution of the silver halide emulsion was measured giving the following results, clearly demonstrating that the physical ripening of the silver halide emulsion was indisputably ended at last at 5 minutes after the end of the silver halide formation:

| time (min) | number average of grain size | standard deviat. |
|---|---|---|
| 1 | 0.334 μm | 0.099 |
| 5 | 0.351 μm | 0.104 |
| 9 | 0.348 μm | 0.102 |

The obtained core-shell silver halide emulsion was cooled, flocculated and washed. Gelatin was added in an amount sufficient to reach a ratio of 2/3 by weight of gelatin to silver halide, expressed as equivalent amount of silver nitrate.

Gelatin silver halide emulsions II and III were prepared as gelatin silver halide emulsions I wherein however no sodium hexachloroiridaat was added to the alkali halide solution but $1*10^{-6}$ mole or $4*10^{-6}$ mole of sodium hexachloroiridaat was added to the silver halide emulsion at 9 minutes after the end of the silver halide formation.

Subsequently a chemical ripening of the silver halide emulsions I to III was carried out in a conventional way, known to those skilled in the art, by using thiosulphate and gold salts.

The silver halide emulsions I to III were red sensitised using a red sensitizing dye. Finally the silver halide emulsions I to III were stabilized by 1-phenyl-5-mercapto-tetrazole.

A base layer coating solution was prepared having the following composition:

| gelatin | 5.5% |
|---|---|
| carbon black | 0.76% |
| silica particles (5 μm) | 1.6% |

Preparation of the imaging elements 1 to 3.

The silver halide emulsion coating solutions I to III were respectively coated simultaneously with the base layer coating solution by means of the cascade coating technique to a polyethylene terephthalate support provided with a pack of two backing layers such that the base layer coating was coated directly to the side of the support opposite to the side containing said backing layers. The silver halide emulsion layers were coated such that the silver halide coverage expressed as $AgNO_3$ was 1.5 $g/m^2$ and the gelatin content was 1.5 $g/m^2$. The silver halide emulsion layers further contained 0.15 $g/m^2$ of 1-phenyl-4,4'-dimethyl-3-pyrazolidone and 0.25 $g/m^2$ of hydroquinone. The base layer was coated such that the amount of gelatin in the coated layer was 3 $g/m^2$.

The layer nearest to the support of the backing layer pack contained 0.3 $g/m^2$ of gelatin and 0.5 $g/m^2$ of the antistatic agent co(tetraallyloxyethane/methacrylate/acrylic acid-K-salt) polymer. The second backing layer contained 4 $g/m^2$ of gelatin, 0.15 $g/m^2$ of a matting agent consisting of transparent spherical polymeric beads of 3 micron average diameter according to EP-A-080,225, 0.05 g/m² of hardening agent triacrylformal and 0.021 g/m² of wetting agent $F_{15}C_7$—COONH$_4$.

The thus obtained elements were dried and subjected to a temperature of 40° C. for 5 days and then the silver halide emulsion layers were overcoated with a layer containing PdS as physical development nuclei, hydroquinone at 0.4 g/m² and formaldehyde at 100 mg/m².

The following processing solutions were prepared:

| Activator solution | |
| --- | --- |
| sodium hydroxide (g) | 30 |
| sodium sulphite anh. (g) | 35 |
| potassium thiocyanate (g) | 20 |
| 2-mercapto-5-n.heptyl-oxa-3,4-diazole (mg) | 150 |
| water to make | 1 l |

| Neutralization solution | |
| --- | --- |
| citric acid | 10 g |
| sodium citrate | 35 g |
| cysteine | 1 g |
| sodium sulphite anh. | 5 g |
| phenol | 50 mg |
| water to make | 1 l |

| Dampening solution | |
| --- | --- |
| water | 880 ml |
| citric acid | 6 g |
| boric acid | 8.4 g |
| sodium sulphate anh. | 25 g |
| ethyleneglycol | 100 g |
| colloidal silica | 28 g |

The above described imaging elements 1 to 3 were image-wise exposed in a HeNe laser image setter and processed with the above described activator for 10 seconds at 30° C., subsequently neutralized at 25° C. with the neutralization solution described above and dried.

The printing plates thus prepared were mounted on the same offset printing machine HEIDELBERG GTO-46, marketed by Heidelberg, A. G., Germany, and were printed under identical conditions. The above mentioned dampening solution was used at a 5% concentration for fountain solution. K+E 125 ink marketed by Kast+Ehinger, A. G., Germany, and a compressible rubber blanket were used in each case.

The sensitometric properties of the developed imaging elements were characterized by the sensitivity (S), reflection density in the image areas ($D_{max}$) and non-image areas ($D_{min}$), the gradation measured by the maximum gradient of the sensitometric curve (G 1), the gradation measured in the toe of the sensitometric curve between 10% and 25% of the density difference (G 2), and the gradation measured in the shoulder of the sensitometric curve between 75% and 95% of the density difference (G 3). The results are shown in table 1.

TABLE 6

| Sample no. | $D_{min}$ | $D_{max}$ | G 1 | G 2 | G 3 | S* |
| --- | --- | --- | --- | --- | --- | --- |
| 1 | 0.62 | 1.26 | 1.40 | 1.25 | 1.23 | ref. |
| 2 | 0.57 | 1.25 | 1.84 | 1.28 | 1.41 | −0.06 |
| 3 | 0.58 | 1.26 | 1.82 | 1.37 | 1.33 | −0.05 |

From the above table 1 it can be seen that the samples according to the invention (2 and 3) show an improved contrast and sharpness of the image as can be revealed from the increased values of the gradation, surely at the maximum gradient and the shoulder of the sensitometric curve and the increased difference between $D_{max}$ and $D_{min}$. A very small decrease in sensitivity is seen for the samples according to the invention. However the obtained values for the sensitivity are still largely within the practical working range for each of the image setters used.

Samples 1 to 3 were used to print as described above and their lithographic properties were evaluated. All three samples could be used to print more than 10000 copies with no adverse effect on the obtained prints.

We claim:

1. A method for obtaining a photographic material by coating on a support at least one layer comprising at least one photosensitive silver halide emulsion, a preparation of said photosensitive silver halide emulsion comprising the steps of (i) formation of a silver halide emulsion by precipitation of silver halide crystals in an aqueous medium, (ii) physical ripening of said silver halide emulsion, (iii) desalination of said silver halide emulsion and (iv) chemical ripening of said silver halide emulsion, the silver halide crystals of said photosensitive silver halide emulsion containing silver chloride for at least 60 mole %, silver bromide in a range from 2 mole % to 40 mole % and silver iodide in a range from 0 mole % to 1 mole %, characterized in that a water soluble iridium compound is added between the end of the physical ripening and the end of the chemical ripening to said silver halide emulsion at a pH between 4 and 6.5, at a pCl between −0.3 and 1 and at a ratio by weight of gelatin to silver halide, expressed as equivalent amount of silver nitrate between 0.05 and 0.5.

2. A method according to claim 1 wherein said water soluble iridium compound is added between the end of the physical ripening and the desalination of the silver halide emulsion.

3. A method according to claim 1 wherein said water soluble iridium compound is added in an amount ranging from $10^{-7}$ to $10^{-5}$ mole per mole AgNO$_3$.

4. A method according to claim 1 wherein said silver halide crystals are of a core-shell type, having substantially all the bromide concentrated in the core.

5. A method according to claim 1 wherein a rhodium containing compound is added to the silver halide emulsion in an amount ranging from $10^{-8}$ to $10^{-3}$ mole per mole AgNO$_3$.

6. A method according to claim 5 wherein said rhodium containing compound is added to the silver halide emulsion during a precipitation stage of said silver halide emulsion.

7. A method according to claim 6 wherein said rhodium containing compound is added to the silver halide emulsion between addition of 2 mole % and 35 mole % of silver salt.

8. A method according to claim 1 wherein on said support is also coated an image receiving layer containing physical development nuclei in water permeable relationship with said silver halide emulsion layer.

9. A method for making an offset printing plate according to a silver salt diffusion transfer process comprising the steps of:

information-wise exposing with a scanning exposure an imaging element obtained by the method of claim 8, wherein said photosensitive silver halide emulsion layer is coated beneath said image receiving layer containing physical development nuclei and developing said imaging element using an alkaline processing liquid in the presence of developing agent(s) and silver halide solvents.

10. A method for making an offset printing plate according to a silver salt diffusion transfer process comprising the steps of:

information-wise exposing with a scanning exposure an imaging element obtained by the method of claim 8, wherein said support has a hydrophilic surface and said photosensitive silver halide emulsion layer is coated above said image receiving layer containing physical development nuclei, applying an aqueous alkaline solution to the imaging element in the presence of developing agent(s) and silver halide solvent(s) to form a silver image in said image receiving layer, treating the imaging element to remove the layer(s) on top of the image receiving layer, thereby exposing the imaged surface of the support by uncovering said silver image formed in said image receiving layer.

* * * * *